United States Patent [19]

Basi

[11] 4,116,714

[45] Sep. 26, 1978

[54] POST-POLISHING SEMICONDUCTOR SURFACE CLEANING PROCESS

[75] Inventor: Jagtar Singh Basi, Fishkill, N.Y.

[73] Assignee: International Business Machines Corporation, Armonk, N.Y.

[21] Appl. No.: 824,382

[22] Filed: Aug. 15, 1977

[51] Int. Cl.² .............................................. B08B 3/08
[52] U.S. Cl. ........................................ 134/3; 51/323; 134/28; 134/29
[58] Field of Search ............................. 134/3, 28, 29; 252/79.2; 51/323; 29/580

[56] References Cited

U.S. PATENT DOCUMENTS

| | | | |
|---|---|---|---|
| 2,744,000 | 5/1956 | Seiler | 134/3 UX |
| 3,715,249 | 2/1973 | Panousis et al. | 252/79.2 X |
| 3,728,154 | 4/1973 | Suzuki | 134/3 |
| 3,871,931 | 3/1975 | Godber | 252/79.2 X |

OTHER PUBLICATIONS

*J. Electrochem. Soc.*, Meek et al., "Silicon Surface Contamination: Polishing and Cleaning", vol. 120, No. 9, Sep. 1973, pp. 1241–1242.

*Primary Examiner*—S. Leon Bashore
*Assistant Examiner*—Marc L. Caroff
*Attorney, Agent, or Firm*—David M. Bunnell

[57] ABSTRACT

Semiconductor materials are cleaned after silica polishing by treatment with an aqueous phosphoric acid containing solution followed by rinsing in water. The treatment dissolves the silica sols so that they are removed from the semiconductor surface.

8 Claims, No Drawings

POST-POLISHING SEMICONDUCTOR SURFACE CLEANING PROCESS

BACKGROUND OF THE INVENTION

This invention relates generally to the cleaning of semiconductor materials and specifically to the post silica polish cleaning of semiconductor wafers.

With the advent of microminiaturization of electronic devices, the need for damage-free, smooth and clean semiconductor wafer surfaces has become increasingly important. Smooth, polished surfaces are obtained by the use of polishing slurries. Silica polishing is an example of a typical polishing process. In the silica polishing process, a polishing slurry is used which includes a colloidal silicon dioxide abrasive, sodium dichloroisocyanurate as an oxidizing agent, and sodium carbonate as a base. The pH of the polishing slurry is below 10. After polishing, it is necessary to clean the polished surface to remove the polishing slurry and other surface contaminants with a minimum of chemical or mechanical surface damage.

At the end of the silica polishing process, removal of the following materials from the wafer surface must be considered in order to produce a clean surface:
1. Colloidal silicon dioxide.
2. Sodium dichloro-isocyanurate and its reaction products with sodium carbonate.
3. Sodium carbonate.
4. Amorphous silicon dioxide.
5. Other metallic impurities deposited on silicon surfaces from slurry components.

Various mechanical and chemical processes have been used to clean silica or other metal oxide based slurry polished wafers. These processes either produce mechanical damage, change the surface characteristics significantly, or use chemicals which present environmental and/or hygienic considerations.

In my copending application Ser. No. 670,508, filed Mar. 25, 1976, now U.S. Pat. No. 4,050,955, an oxidizing agent treatment is discribed using, for example, a NaClO followed by an $NH_4OH$ rinse.

In my copending application Ser. No. 799,886, filed May 23, 1977, a process is described which uses quarternary ammonium salts to obtain a clean, hydrophobic semiconductor surface without damaging the surface.

A new, environmentally safe and effective method has been found to remove silica polishing materials which provides a clean, damage-free hydrophillic semiconductor surface.

BRIEF SUMMARY OF THE INVENTION

In accordance with this invention there is provided a method of removing silica residue from a semiconductor surface following the polishing of the surface with a silica abrasive slurry comprising treating the surface with a aqueous phosphoric acid solution and removing the solution from the surface. The surface can be further treated with $H_2SO_4$ and $NH_4OH$.

DETAILED DESCRIPTION

The silicon dioxide based aqueous slurries used in polishing semiconductor surfaces include colloidal silicon dioxide as the abrasive material, an oxidizing agent such as sodium dichloroisocyanurate and a base such as sodium carbonate.

After polishing with silicon dioxide slurries, the surface is contaminated with a residue of colloidal $SiO_2$, amorphous $SiO_2$, sodium carbonate and polishing pad material. Water washing alone does not remove the contaminants.

It is known that silicon dioxide reacts with phosphoric acid at high temperatures (above 200° C.) to produce various silicon phosphates depending upon reaction conditions, for example, G. R. Levi et al; Z. Krist 92, 191 (1935). It is also known that solid silica gel reacts with dilute phosphoric acid to produce a surface film which retards $SiO_2$ solubility in both water and phosphoric acid, for example B. M. Mitsynk, Zh. Neorg Khim, 17 903 (1972). Surprisingly, in view of these disclosures it has been found that, unlike solid silicon dioxide, colloidal silicon dioxide dissolves rapidly in dilute phosphoric acid at ambient temperatures so that the wafers are easily cleaned without damage. The hydrophobic nature of the surface is changed to hydrophillic which is probably caused by the acid hydrolysis of siloxane groups at the silicon surface. The surface hydrolysis and dissolution processes are enhanced by an $H_2SO_4$ treatment as illustrated in Example 1. The process permits storage of the semiconductor before cleaning by placing them in a dilute aqueous phosphoric acid solution without resulting water stains or haze on the semiconductor surface following cleaning.

Suitable concentrations of phosphoric acid in water range from 10–50% by weight with about 20–30% preferred. After the polishing operation is completed, the semiconductor substrates are removed from the polishing machine without letting them dry. They can then be immediately cleaned or they can be stored in the phosphoric acid cleaning solution for extended periods of time (24 hours, for example) and still be easily and effectively cleaned by the process of the invention to produce haze-free surface.

To clean the substrates they are first sprayed or dipped in the aqueous phosphoric acid solution at ambient temperatures (20° to 30° C.) for preferably about 5 to 10 minutes and then rinsed in water which removes loosly adhering particles and the phosphoric acid solution. It is preferred to next treat the substrates with a dilute (20–30% by weight) aqueous sulfuric acid solution which helps to dissolve any silicophosphates and promotes surface hydrolysis. Alternatively, the sulfuric acid can be added to the phosphoric acid solution. Where heavy metal ion contamination may be present, the water rinsed substrates are then rinsed (dip or spray) with dilute aqueous $NH_4OH$ (about 3 to 5% by weight). A complexing agent could also be added to the $NH_4OH$ solution to aid in ion removal. The semiconductor is then rinsed in water and be brush cleaned with water.

The invention is further illustrated by, but is not intended to be limited to the following examples in which parts are parts by weight unless otherwise indicated.

EXAMPLE 1

Freshly polished and rinsed silicon wafers are placed in an aqueous solution of 21 percent by weight phosphoric acid for 10 minutes and then are removed and rinsed for 2 minutes in flowing deionized water. The wafers are placed in 20 percent by weight aqueous sulfuric acid for 5 minutes, rinsed with deionized water for 2 minutes followed by a 3% aqueous $NH_4OH$ rinse for 30 seconds. They are then spray rinsed with deionized water and spun dry in a hot nitrogen atmosphere. The operation is carried out in an automatic Corotek rinse-dryer. The wafers are brush or felt cleaned with deionized water. Examination of the surface under a bright light showed an absense of any silica or other particulate contaminates.

The above process can be modified to eliminate two steps by using an aqueous solution of 21 percent by weight phosphoric acid and 20 percent by weight sulfuric acid in the initial step. This eliminates the separate sulfuric acid treatment and second water rinse step.

EXAMPLE 2

Silicon wafers, which were polished with a silica polishing slurry and then water rinsed, are taken from the polishing machine and, without drying are placed into a 20% by weight aqueous solution of phosphoric acid for 5 minutes at room temperature. The wafers are removed from solution and rinsed with deionized water for 3 minutes and then treated in a spray of 3% by weight aqueous $NH_4OH$ for 30 seconds followed by a spray rinse with deionized water and spin drying in a hot nitrogen atmosphere. The entire rinsing process is performed in an automated Corotek spray dry machine taking a total of about 10 minutes. The wafers are hydrophillic after the cleaning process (water wets the surface). The wafer surfaces are clean and haze-free. An emission spectrographic analysis of the cleaned wafers indicated negligible amounts of Al, Ca, Cr, Cu, Fe, Mg, Na and Ti.

The above cleaning process was repeated on wafers which had been stored for up to 24 hours in the cleaning solution and gave clean surfaces without leaving a water mark or stain on the wafers.

The foregoing process provides polished semiconductor surfaces which are clean, haze free and hydrophillic. The surfaces are not degraded by the cleaning process and the process employs environmentally and hygenically acceptable materials. The semiconductor materials can be stored in the dilute phosphoric acid solution for up to 24 hours before cleaning without any significant surface deterioration. Only light brush cleaning is needed to remove any particles from the cleaned surfaces.

While the invention has been particularly shown and described with reference to preferred embodiments thereof, it will be understood by those skilled in the art that various changes in form and detail may be made therein without departing from the spirit and scope of the invention.

What is claimed is:

1. In a method for cleaning a semiconductor surface following polishing of said surface with a polishing slurry containing a colloidal silica abrasive, the improvement comprising removing silica residue by contacting the surface with an aqueous phosphoric acid solution containing about 10 to 50 percent by weight phosphoric acid at a temperature of about 20° to 30° C. and then removing the solution from said surface.

2. The method of claim 1 wherein said solution contains from about 20–30 percent by weight phosphoric acid.

3. The method of claim 2 wherein said solution contains from about 20–30 percent by weight sulfuric acid.

4. The method of claim 1 wherein the solution is removed from the surface with a water rinse and the surface is further contacted with an aqueous solution of sulfuric acid containing 20–30% by weight sulfuric acid, rinsed with water and then contacted with an aqueous $NH_4OH$ solution containing 3–5% by weight $NH_4OH$ to remove heavy metal ion contaminants.

5. The method of claim 4 wherein the solution contains about 20 percent by weight phosphoric acid, said aqueous solution of sulfuric acid contains about 20 percent by weight sulfuric acid and said aqueous $NH_4OH$ solution contains about 3 percent by weight $NH_4OH$.

6. The method of claim 1 wherein the silica residue includes colloidal and amorphous silicon dioxide.

7. The method of claim 1 wherein the removing of the solution from said surface includes a water rinse.

8. The method of claim 1 wherein the semiconductor material is silicon.

* * * * *